(12) United States Patent
Lim (10) Patent No.: US 12,183,835 B2
(45) Date of Patent: Dec. 31, 2024

(54) SYNAPTIC DEVICE

(71) Applicant: Electronics and Telecommunications Research Institute, Daejeon (KR)

(72) Inventor: JungWook Lim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/903,149

(22) Filed: Sep. 6, 2022

(65) Prior Publication Data

US 2023/0155037 A1 May 18, 2023

(30) Foreign Application Priority Data

Nov. 17, 2021 (KR) .................. 10-2021-0158842
Mar. 14, 2022 (KR) .................. 10-2022-0031215

(51) Int. Cl.
*H01L 29/84* (2006.01)

(52) U.S. Cl.
CPC .................................. *H01L 29/84* (2013.01)

(58) Field of Classification Search
CPC . G01L 1/16; G01L 1/18; H01L 29/516; H01L 29/4908; H01L 29/7869; H01L 29/84
See application file for complete search history.

(56) References Cited

U.S. PATENT DOCUMENTS

| | | |
|---|---|---|
| 9,773,204 B2 | 9/2017 | Lee |
| 2009/0127977 A1* | 5/2009 | So .................. H01L 29/4908 310/322 |
| 2011/0049579 A1 | 3/2011 | Dumitru et al. |
| 2011/0266542 A1 | 11/2011 | Ryu et al. |
| 2012/0172648 A1* | 7/2012 | Seebauer ............... B01J 21/063 502/343 |
| 2014/0312400 A1 | 10/2014 | Schmidt et al. |
| 2018/0120938 A1* | 5/2018 | Frescas .............. H10N 30/2042 |
| 2020/0025635 A1 | 1/2020 | Kim |

(Continued)

FOREIGN PATENT DOCUMENTS

| | | |
|---|---|---|
| JP | 2008-180953 A | 8/2008 |
| KR | 10-2017-0080439 A | 7/2017 |
| KR | 10-2321010 B1 | 11/2021 |

OTHER PUBLICATIONS

Kim, Taeyoon, et al. "Multi-Level Long-Term Memory Resembling Human Memory Based on Photosensitive Field-Effect Transistors with Stable Interfacial Deep Traps." *Advanced Electronic Materials* 6.4 (Jan. 29, 2020): 1901044.

(Continued)

*Primary Examiner* — Raj R Gupta
(74) *Attorney, Agent, or Firm* — NSIP Law (57) ABSTRACT

Provided is a synaptic device including a substrate, a channel layer on the substrate, a gate dielectric layer on the channel layer; and a gate electrode on the gate dielectric layer, wherein the gate dielectric layer includes a charge supply dielectric film and a piezoelectric film, wherein the charge supply dielectric film includes a metal oxide or metal sulfide, wherein the piezoelectric film includes a piezoelectric material that converts a pressure stimulation into an electrical signal, wherein accordance to a change in a signal applied to the gate electrode, a magnitude and aspect of a current flowing through the channel layer are changed.

10 Claims, 6 Drawing Sheets

(56) References Cited

U.S. PATENT DOCUMENTS

2020/0356207 A1  11/2020  Routley et al.
2021/0159252 A1* 5/2021  Okamoto ............ H01L 27/1207

OTHER PUBLICATIONS

Lim, Jung Wook, et al. "Photoinduced Synaptic Behavior of InxTiyO Thin Film Transistors." *Advanced Electronic Materials* 7.4 (2021): 2001049.

* cited by examiner

SYNAPTIC DEVICE

CROSS-REFERENCE TO RELATED APPLICATIONS

This U.S. non-provisional patent application claims priority under 35 U.S.C. § 119 of Korean Patent Application Nos. 10-2021-0158842, filed on Nov. 17, 2021, and 10-2022-0031215, filed on Mar. 14, 2022, the entire contents of which are hereby incorporated by reference.

BACKGROUND

The present disclosure relates to a synaptic device, and more particularly, to a complex synaptic device that responds to and remembers pressure stimulation, optical stimulation, and electrical stimulation.

Synaptic devices have been initially studied focusing on a two-terminal Metal-Variable Resistance Insulator-Metal (MIM) structure that includes a variable resistance between two electrodes. In this case, the variable resistor implements various conductivity states (i.e., current states) according to an applied voltage, and maintains and stores this state. The most representative variable resistance insulator shows a characteristic in which a conductive channel is generated and then disappears due to the formation of filaments such as ions or vacancy. In addition, a synaptic device capable of trapping a large number of charges by distributing multi-stage energy levels in a variable resistor has also been proposed.

According to the limitations of such a two-terminal-based synaptic device, research on a three-terminal synaptic device is in progress. In particular, recently, a synaptic device including a channel and three-terminal electrodes made of a two-dimensional semiconductor material such as oxide semiconductor, graphene, or MoS2 has been developed.

SUMMARY

The present disclosure provides a complex synaptic device that responds to and remembers pressure stimulation, optical stimulation, and electrical stimulation.

An embodiment of the inventive concept provides a synaptic device including: a substrate; a channel layer on the substrate; a gate dielectric layer on the channel layer; and a gate electrode on the gate dielectric layer, wherein the gate dielectric layer includes a charge supply dielectric film and a piezoelectric film, wherein the charge supply dielectric film includes a metal oxide or metal sulfide, wherein the piezoelectric film includes a piezoelectric material that converts a pressure stimulation into an electrical signal, wherein accordance to a change in a signal applied to the gate electrode, a magnitude and aspect of a current flowing through the channel layer are changed.

In an embodiment, the channel layer may include at least one of $TiO_2$, $In_2O_3$, $SnO_2$, ZnO, InTiO, SnTiO, ZnTiO, InSnO, ZnSnO, and InZnO.

In an embodiment, the piezoelectric film may include at least one of PbZrTiO (PZT), BaSrTiO (BST), $HfO_2$ and HfZrO.

In an embodiment, the charge supply dielectric film may be interposed between the channel layer and the gate electrode, wherein the piezoelectric film may be interposed between the charge supply dielectric film and the gate electrode.

In an embodiment, the piezoelectric film may be interposed between the channel layer and the gate electrode, wherein the charge supply dielectric film may be interposed between the piezoelectric film and the gate electrode.

In an embodiment, the synaptic device may further include a source electrode and a drain electrode on the channel layer, wherein the gate electrode, the source electrode, and the drain electrode may include at least one of Al, Ag, Au, Pt, Mo, Ni, TiN, ITO, AlZnO (AZO), GaZnO, AZO/Ag/AZO (OMO structure), and $SnO_2$.

In an embodiment, the gate electrode may be interposed between the gate dielectric layer and the substrate, wherein the source electrode and the drain electrode may be provided on the gate dielectric layer and cover at least a portion of the channel layer.

In an embodiment, the source electrode and the drain electrode may be horizontally spaced apart from each other, wherein the channel layer may be exposed to the outside between the source electrode and the drain electrode.

In an embodiment, the substrate may include at least one of silicon, silicon oxide, metal, compound semiconductor, glass, polyimide, PET, PEN, TAC, and metal foil.

In an embodiment, the synaptic device may further include a touch panel on the gate electrode.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

In order to fully understand the configuration and effects of the inventive concept, preferred embodiments of the inventive concept will be described in detail with reference to the accompanying drawings.

The inventive concept is not limited to the embodiments disclosed below, but may be implemented in various forms, and various modifications and changes may be added. However, it is provided to completely disclose the technical idea of the inventive concept through the description of the present embodiments, and to fully inform a person of ordinary skill in the art to which the inventive concept belongs. In the accompanying drawings, the components are shown to be enlarged in size for convenience of description, and the ratio of each component may be exaggerated or reduced.

The terms used in this specification are for describing embodiments and are not intended to limit the inventive concept. In addition, terms used in the present specification may be interpreted as meanings commonly known to those of ordinary skill in the art, unless otherwise defined.

In this specification, the singular form also includes the plural form unless specifically stated in the phrase. As used in the specification, in relation to 'comprises' and/or 'comprising', the mentioned elements, steps, operations and/or elements do not exclude the presence or addition of one or more other elements, steps, operations and/or elements.

In the case where a layer is referred to herein as being 'on' another layer, it may be formed directly on the upper surface of the other layer or a third layer may be interposed therebetween.

In the present specification, terms such as first and second are used to describe various regions, layers, and the like, but these regions and layers should not be limited by these terms. These terms are only used to distinguish one region or layer from another region or layer. Accordingly, a portion referred to as a first portion in one embodiment may be referred to as a second portion in another embodiment. The embodiments described and illustrated herein also include complementary embodiments thereof. Like reference numerals refer to like elements throughout the specification.

Hereinafter, a synaptic device according to embodiments of the inventive concept will be described in detail with reference to the drawings.

Figure 1:
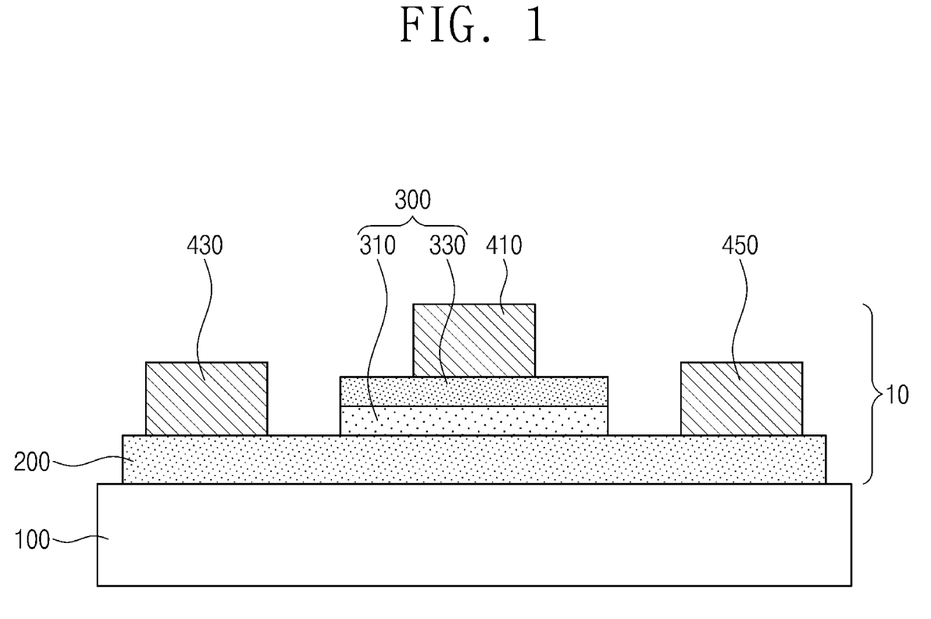
FIGS. 1 and 2 are cross-sectional views for explaining a synaptic device according to embodiments of the inventive concept.

FIG. 1 is a cross-sectional view for explaining a synaptic device according to embodiments of the inventive concept.

Referring to FIG. 1, a synaptic device according to the inventive concept may include a substrate 100 and a transistor structure 10 on the substrate 100. The substrate 100 may include, for example, at least one of silicon, silicon oxide, metal, compound semiconductor, glass, polyimide, PET, PEN, TAC, and metal foil.

The transistor structure 10 on the substrate 100 may include a channel layer 200, a gate dielectric layer 300, a gate electrode 410, a source electrode 430, and a drain electrode 450. The transistor structure 10 may be formed by a semiconductor process, and accordingly, the synaptic device according to the inventive concept may have high compatibility with the CMOS process. The thickness of the transistor structure 10 may be about 10 μm or less. More preferably, the thickness of the transistor structure 10 may be about 1 μm or less.

The channel layer 200 may be provided on the substrate 100. The lower surface of the channel layer 200 may directly contact the upper surface of the substrate 100. The channel layer 200 may include an oxide semiconductor. The channel layer 200 may include, for example, at least one of $TiO_2$, $In_2O_3$, $SnO_2$, ZnO, InTiO, SnTiO, ZnTiO, InSnO, ZnSnO, and InZnO. According to embodiments, the channel layer 200 may further include crystalline silicon and other semiconductor materials.

The gate dielectric layer 300 may be provided on the channel layer 200. The gate dielectric layer 300 may include a charge supply dielectric film 310 and a piezoelectric film 330 sequentially stacked on the channel layer 200. The charge supply dielectric film 310 may be interposed between the channel layer 200 and the piezoelectric film 330. The piezoelectric film 330 may be interposed between the charge supply dielectric film 310 and the gate electrode 410.

The charge supply dielectric film 310 may include a metal oxide or a metal sulfide. Specifically, the charge supply dielectric film 310 may include an oxide (or sulfide) in which oxygen (or sulfur) is excessive or deficient. The charge supply dielectric film 310 may include ions, electrons, or holes therein. Movement of ions, electrons, or holes inside the charge supply dielectric film 310 may affect a change in the magnitude and shape of a current flowing through the channel layer 200.

When ions are present inside the charge supply dielectric film 310, ions may move toward the channel layer 200 or away from the channel layer 200 according to the polarity thereof and the direction of the voltage applied to the gate electrode 410.

When electrons or holes exist inside the charge supply dielectric film 310, the electrons or holes move in the direction toward the channel layer 200 according to the direction of the voltage applied to the gate electrode 410 so that the electrons or holes may be trapped at the interface with the channel layer 200, or may move away from the channel layer 200 to escape from the interface with the channel layer 200.

The piezoelectric film 330 may include a piezoelectric material that converts a pressure stimulation into an electrical signal. The piezoelectric film 330 may include, for example, at least one of PbZrTiO (PZT), BaSrTiO (BST), $HfO_2$ and HfZrO.

When a pressure stimulation is transmitted through the gate electrode 410, the piezoelectric film 330 may convert a pressure stimulation into an electrical signal to move electric charges inside the charge supply dielectric film 310. In other words, the piezoelectric film 330 may make a change in the current flow of the channel layer 200 and further induce synaptic characteristics.

A gate electrode 410 may be provided on the gate dielectric layer 300. A source electrode 430 and a drain electrode 450 may be provided on the channel layer 200. For example, the source electrode 430 and the drain electrode 450 may be horizontally spaced apart from the sidewall of the gate dielectric layer 300. Each of the gate electrode 410, the source electrode 430, and the drain electrode 450 may include a metal material (e.g., a transparent electrode material).

The gate electrode 410, the source electrode 430, and the drain electrode 450 may each include, for example, at least one of Al, Ag, Au, Pt, Mo, Ni, TiN, ITO, AlZnO (AZO), GaZnO, AZO/Ag/AZO (OMO structure), and $SnO_2$.

Figure 2:
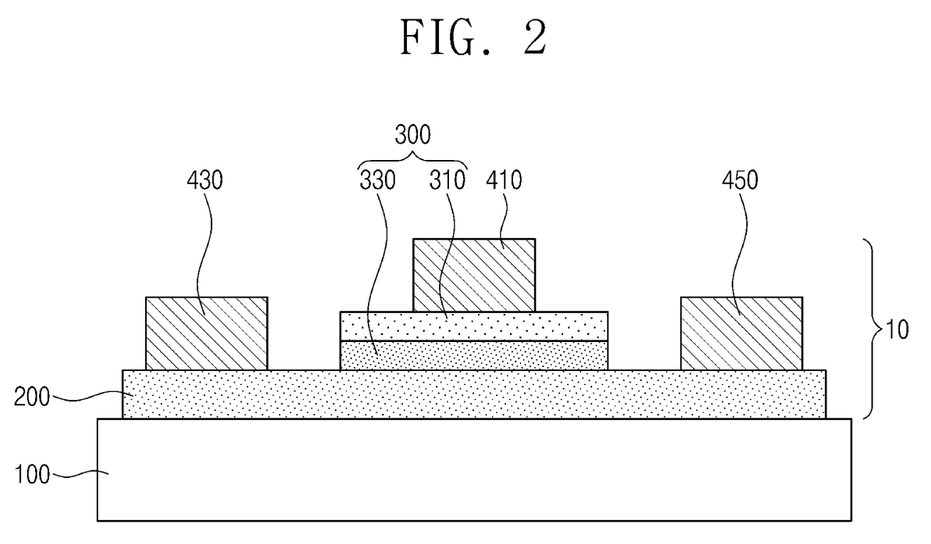

FIG. 2 is a cross-sectional view for explaining a synaptic device according to embodiments of the inventive concept. For convenience of description, descriptions of items substantially the same as those described with reference to FIG. 1 will be omitted and differences will be described in detail.

Referring to FIG. 2, the piezoelectric film 330 of the gate dielectric layer 300 may be interposed between the channel layer 200 and the charge supply dielectric film 310. The charge supply dielectric film 310 of the gate dielectric layer 300 may be interposed between the piezoelectric film 330 and the gate electrode 410. Compared with FIG. 1, the stacking order of the charge supply dielectric film 310 and the piezoelectric film 330 may be changed.

Figure 3A:
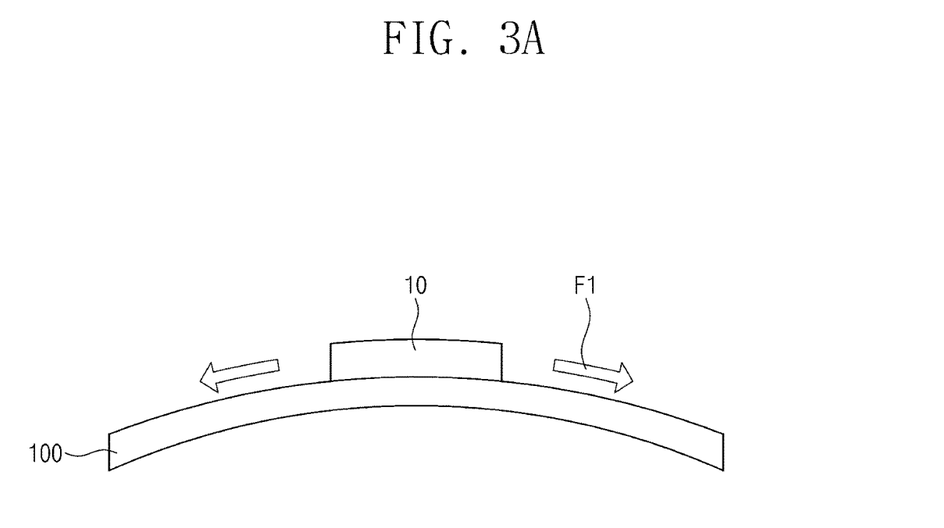
FIGS. 3A and 3B are conceptual views for explaining a situation in which a tensile pressure pulse is applied to a synaptic device according to embodiments of the inventive concept.
Figure 3B:
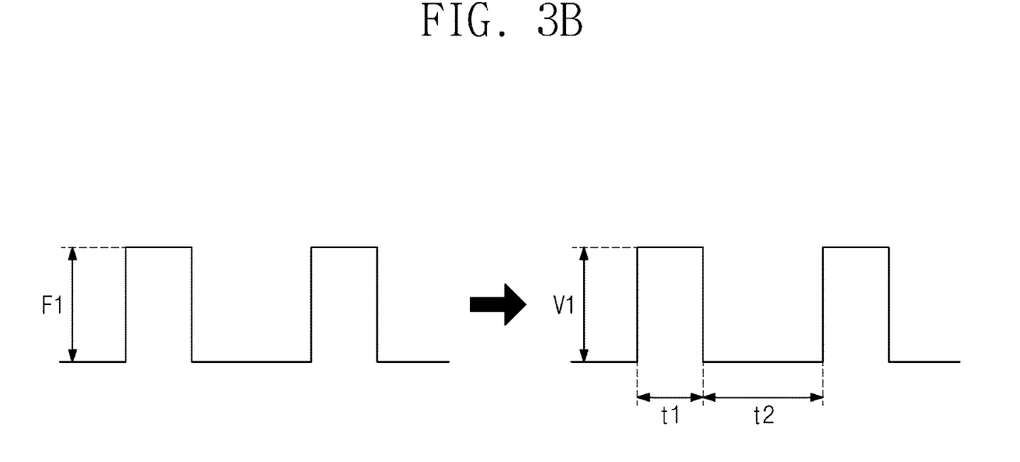
Figure 4A:
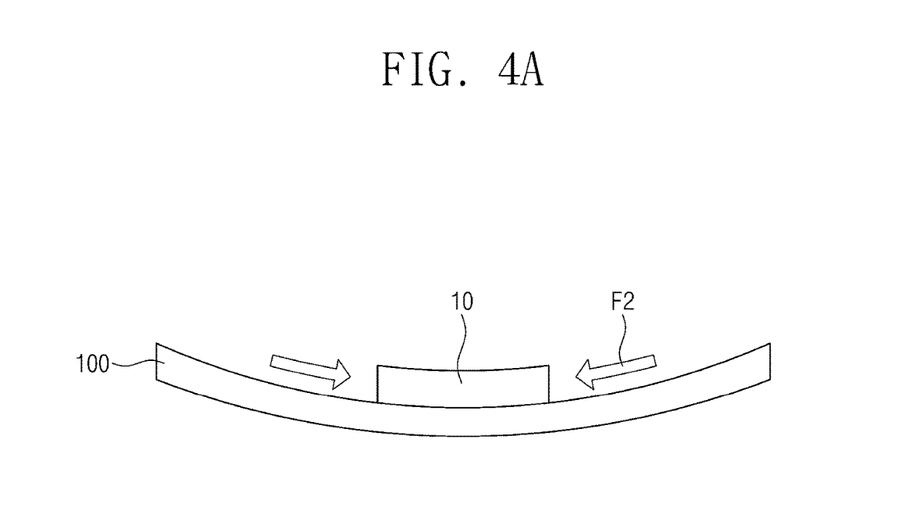
FIGS. 4A and 4B are conceptual views for explaining a situation in which a compressive pressure pulse is applied to a synaptic device according to embodiments of the inventive concept.
Figure 4B:
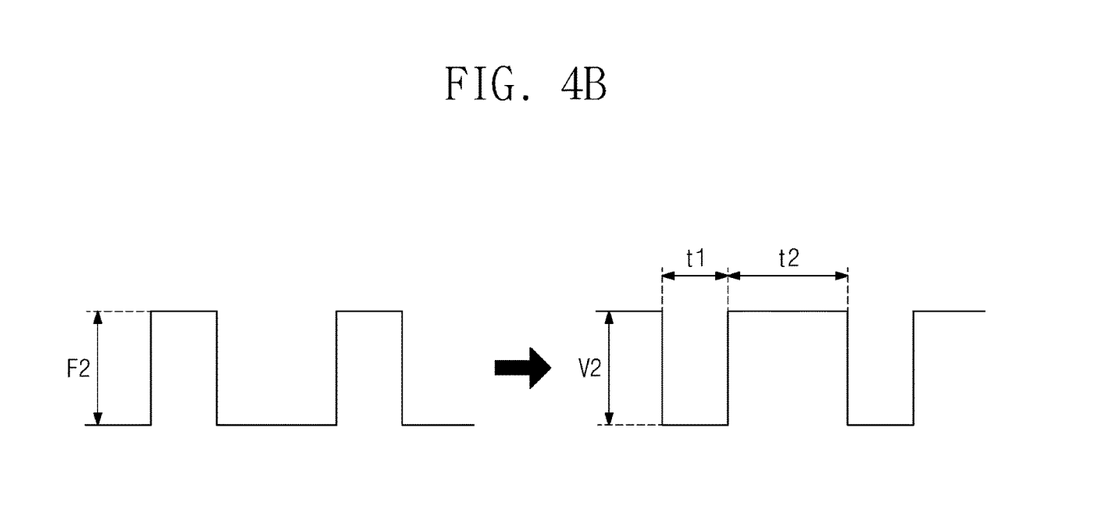

FIGS. 3A and 3B are conceptual views for explaining a situation in which a tensile pressure pulse is applied to a synaptic device according to embodiments of the inventive concept. FIGS. 4A and 4B are conceptual views for explaining a situation in which a compressive pressure pulse is applied to a synaptic device according to embodiments of the inventive concept.

Referring to FIGS. 3A, 3B, 4A and 4B, when the tensile pressure F1 or the compressive pressure F2 is applied to the synaptic device according to the inventive concept in the form of a pulse, an electric pulse corresponding to each may be generated. In the electrical pulse, the first time interval t1 may be referred to as a pulse time interval, and the second time interval t2 may be referred to as a standby time interval.

When the tensile pressure F1 is applied, an electrical pulse having the first voltage V1 as a peak voltage may be generated in the transistor structure 10 on the substrate 100. The first voltage V1 may be a positive voltage, and the magnitude of the first voltage V1 may be proportional to the magnitude of the tensile pressure F1.

When the compressive pressure F2 is applied, an electrical pulse having the second voltage V2 as a peak voltage may be generated in the transistor structure 10 on the substrate 100. The second voltage V2 may be a negative voltage, and the magnitude of the second voltage V2 may be proportional to the magnitude of the compressive pressure F2.

In other words, the sign of the electrical pulse induced in the transistor structure 10 may be changed according to whether the tensile pressure F1 or the compressive pressure F2 is applied. As a result, different types of synaptic characteristics may be induced according to potentiation and depression in the synaptic device according to the inventive concept.

Figure 5:
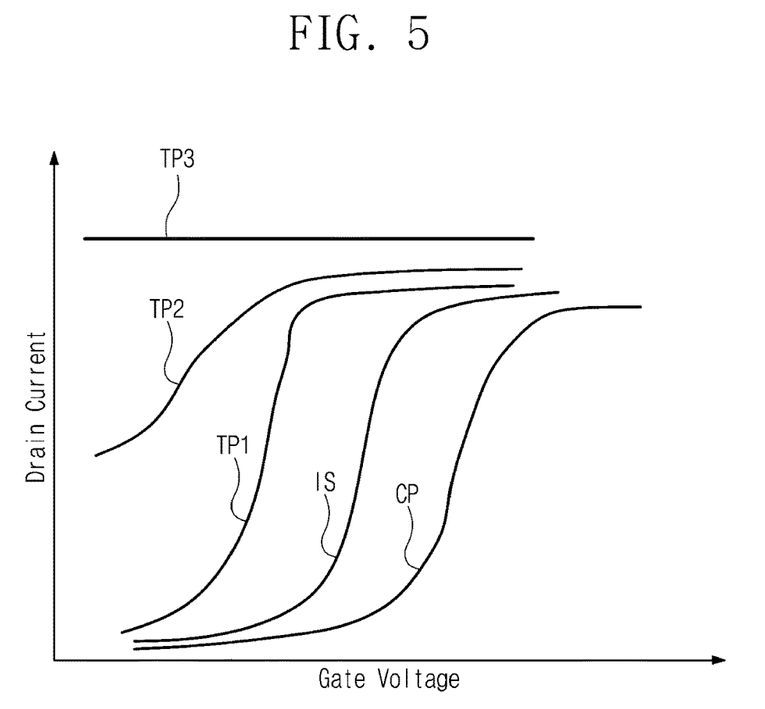
FIG. 5 is a graph illustrating a change in drain current with respect to a gate voltage when a tensile pressure pulse or a compressive pressure pulse is applied to a synaptic device according to embodiments of the inventive concept.

FIG. 5 is a graph illustrating a change in drain current with respect to a gate voltage when a tensile pressure pulse or a compressive pressure pulse is applied to a synaptic device according to embodiments of the inventive concept.

Referring to FIG. 5, the initial state curve IS is a transfer curve indicating the change in drain current with respect to the gate voltage of the synaptic device before the input pulse is applied. The first tensile pressure curve TP1 is a transfer curve when two tensile pressure pulses are applied, the second tensile pressure curve TP2 is a transfer curve when four tensile pressure pulses are applied, and the third tensile pressure curve TP3 is a transfer curve when six tensile pressure pulses are applied. The compressive pressure curve CP is a transfer curve when two compressive pressure pulses are applied.

When a tensile pressure pulse is applied, a change in the threshold voltage may occur. As the number of tensile pressure pulses increases, the curve may shift from the initial state curve IS in a negative direction, and the threshold voltage may also shift in a negative direction. When six tensile pressure pulses are applied as shown in the third tensile pressure curve TP3, a synaptic device may exhibit the tendency of a metal-like conductor (conductor curve), and may lose the switching capability of the semiconductor. A synaptic device according to the inventive concept may reversibly change between a conductor curve and a semiconductor curve upon application of a pressure pulse.

On the other hand, even when a compressive pressure pulse is applied, a change in the threshold voltage may occur. However, when compressive pressure pulses are applied, the curve may shift in a positive direction from the initial state curve IS, and the threshold voltage may also shift in a positive direction.

The direction of movement of the curve when tensile pressure pulses are applied and compressive pressure pulses are applied may be opposite to those described depending on the material and/or structure of the synaptic device according to the inventive concept.

In other words, both potentiation in which the drain current is continuously amplified and depression in which the current is continuously reduced according to the magnitude and number of pulses applied from the synaptic device according to the inventive concept are possible. When a pressure signal is applied, the change in current flowing through the channel layer 200 by the charge supply dielectric film 310 and the piezoelectric film 330 between the channel layer 200 and the gate electrode 410 enables such learning.

Figure 6:
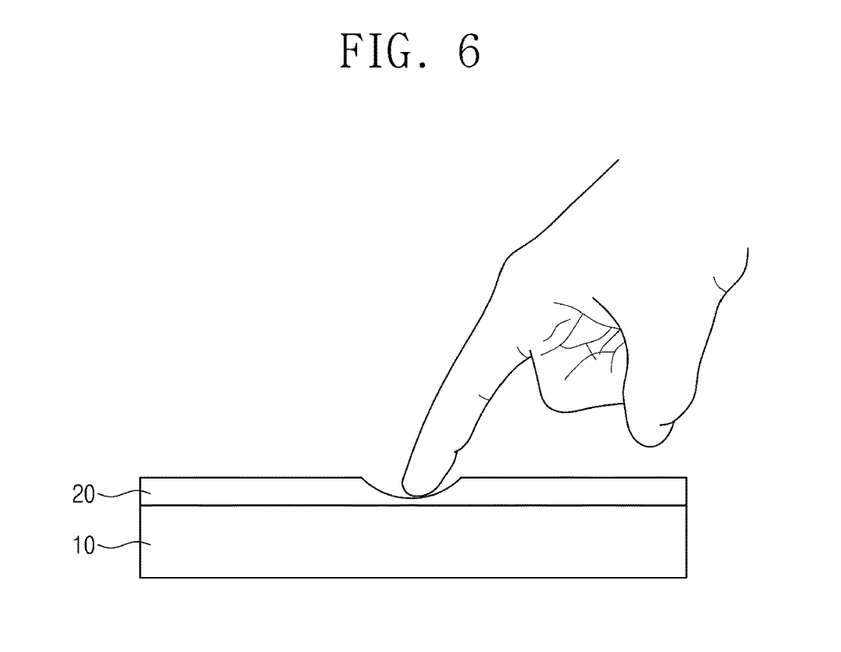
FIG. 6 is a cross-sectional view illustrating an example use of a synaptic device according to one or more embodiments.

FIG. 6 is a cross-sectional view for explaining an example of use of a synaptic device according to embodiments of the inventive concept.

Referring to FIG. 6, the synaptic device according to the inventive concept may further include a touch panel 20 provided on the transistor structure 10 described with reference to FIG. 1 or 2. For example, as the number of touches in contact with the touch panel 20 increases, a current flowing through the transistor structure 10 may continuously increase, and thus potentiation may be achieved.

Figure 7A:
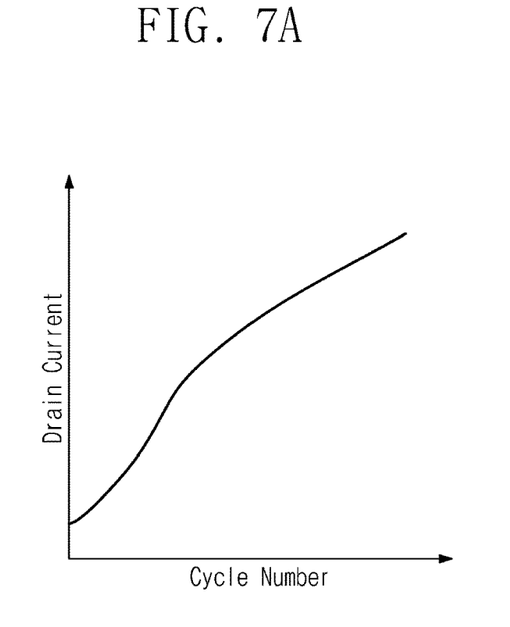
FIGS. 7A and 7B are graphs illustrating a change in drain current according to the number of cycles of a pulse when an electric pulse is applied to a synaptic device according to embodiments of the inventive concept.
Figure 7B:
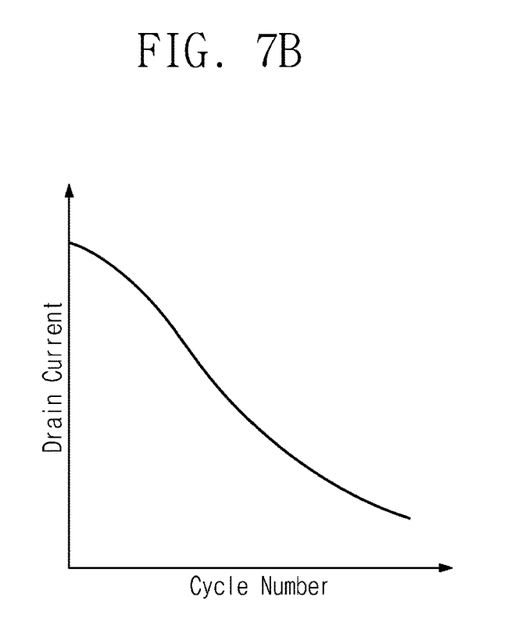

FIGS. 7A and 7B are graphs illustrating a change in drain current according to the number of cycles of a pulse when an electric pulse is applied to a synaptic device according to embodiments of the inventive concept.

Referring to FIGS. 7A and 7B, synaptic characteristics may be implemented even when an electrical signal other than a pressure signal is applied to the gate electrode 410 (refer to FIG. 1). Referring to FIG. 7A, when a positive electric pulse is applied, potentiation may occur. Referring to FIG. 7B, when a negative electric pulse is applied, depression may occur. Since the synaptic device according to the inventive concept traps ions, electrons, or holes in a deep trap structure between the gate dielectric layer 300 (see FIG. 1) and the channel layer 200 (see FIG. 1), during potentiation or depression, the drain current may change relatively linearly with the number of cycles of the pulse, and accordingly, the accuracy of the synaptic device according to the inventive concept may be increased.

Figure 8:
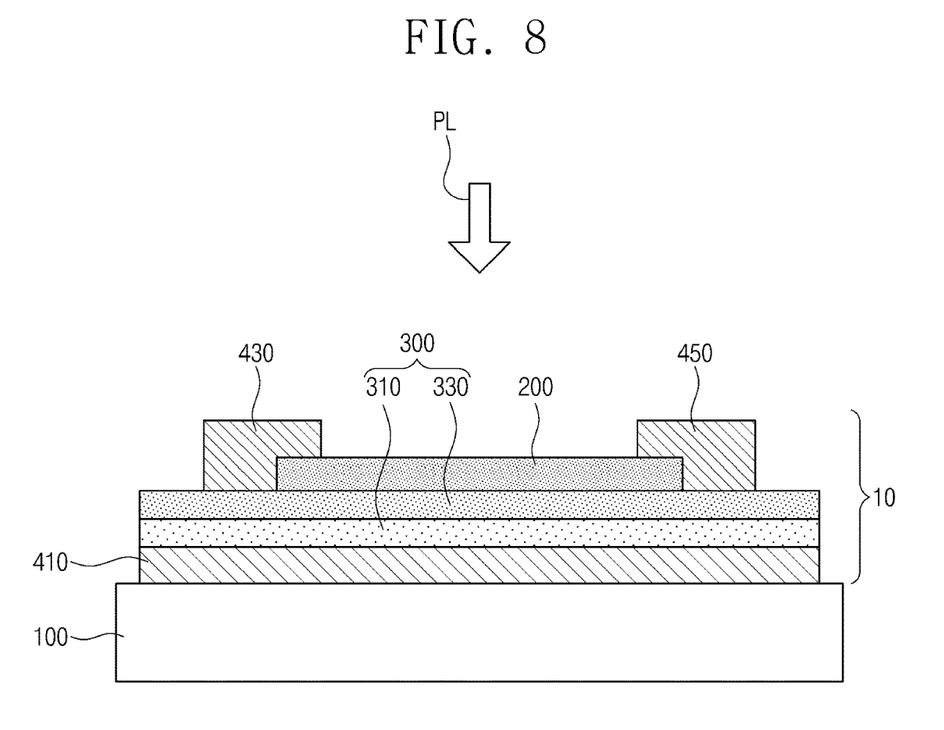
FIG. 8 is a cross-sectional view for explaining a synaptic device according to embodiments of the inventive concept.

FIG. 8 is a cross-sectional view for explaining a synaptic device according to embodiments of the inventive concept. For convenience of description, descriptions of items substantially the same as those described with reference to FIG. 1 will be omitted and differences will be described in detail.

Referring to FIG. 8, a gate electrode 410 may be provided on the substrate 100. The lower surface of the gate electrode 410 may directly contact the upper surface of the substrate 100. A gate dielectric layer 300 may be provided on the gate electrode 410. A channel layer 200 may be provided on the gate dielectric layer 300. In other words, the gate dielectric layer 300 may be interposed between the gate electrode 410 and the channel layer 200. The source electrode 430 and the drain electrode 450 may be provided on the gate dielectric layer 300 and may cover at least a portion of the channel layer 200. The source electrode 430 and the drain electrode 450 may be horizontally spaced apart from each other so that the pulsed light PL is incident into a space therebetween. The channel layer 200 may be exposed to the outside between the source electrode 430 and the drain electrode

450. The pulsed light PL may be, for example, short-wavelength light of an ultraviolet or visible light band.

The channel layer 200 may generate an electric charge for a portion of ultraviolet or visible light according to its energy bandgap, and in this case, the generated charges may be trapped at the interface between the channel layer 200 and the gate dielectric layer 300 to cause a change in the drain current. More specifically, the pulsed light PL incident into the space between the source electrode 430 and the drain electrode 450 may pass through the gate dielectric layer 300 to reach the channel layer 200, and generate electron/hole pairs within the channel layer 200. The electron/hole pairs generated in the channel layer 200 may be trapped in the deep trap structure between the channel layer 200 and the gate dielectric layer 300 and serve as a stable space charge. These space charges may induce a shift in the transfer curve, leading to synaptic characteristics with excellent durability.

Figure 9:
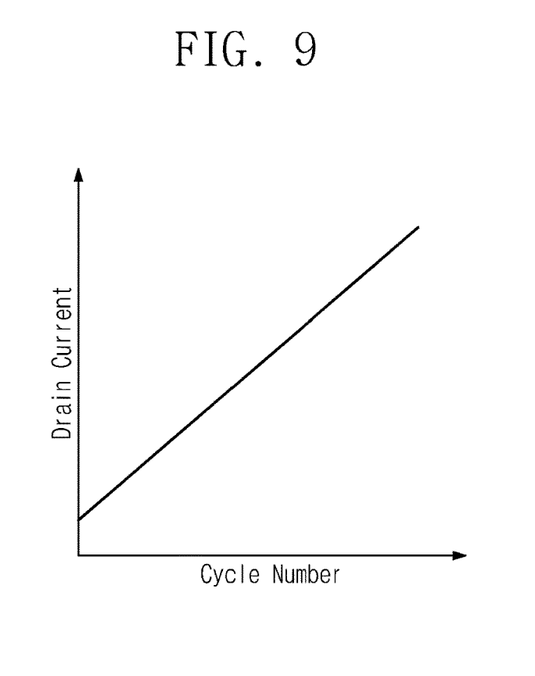
FIG. 9 is a graph illustrating a change in drain current according to the number of cycles of a pulse when a light pulse is applied to a synaptic device according to embodiments of the inventive concept.

FIG. 9 is a graph illustrating a change in drain current according to the number of cycles of a pulse when a light pulse is applied to a synaptic device according to embodiments of the inventive concept.

Referring to FIGS. 8 and 9, as the number of cycles of the pulsed light PL increases, potentiation in which the drain current linearly increases may be achieved. When the electric signal is applied together with the pulsed light PL, the linearity of the graph may be further improved. Accordingly, the synaptic device according to the inventive concept may be applied to various devices using an optical input and/or an electrical input as well as an artificial intelligence device using a pressure input such as a touch panel.

The synaptic device according to the inventive concept may respond to and remember pressure stimulation, optical stimulation, and electrical stimulation.

In addition, the synaptic device according to the inventive concept has high compatibility with the CMOS process due to the use of an oxide semiconductor, and thus mass production may be facilitated in the future.

In addition, the synaptic device according to the inventive concept may be applied to various devices using an optical input and/or an electrical input as well as an artificial intelligence device using a pressure input such as a touch panel.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A synaptic device comprising:
a substrate;
a channel layer on the substrate;
a gate dielectric layer on the channel layer; and
a gate electrode on the gate dielectric layer,
wherein the gate dielectric layer comprises a charge supply dielectric film and a piezoelectric film,
wherein the charge supply dielectric film comprises a metal oxide or a metal sulfide,
wherein the piezoelectric film comprises a piezoelectric material that converts a pressure stimulation into an electrical signal,
wherein accordance to a change in a signal applied to the gate electrode, a magnitude and aspect of a current flowing through the channel layer are changed, and
wherein the gate electrode is in direct mechanical contact with a top surface of the piezoelectric film,
wherein the gate electrode, the piezoelectric film, the charge supply dielectric film and the channel layer overlap each other,
wherein the gate electrode is disposed at a higher level than a level of the piezoelectric film,
wherein a content of oxygen of the metal oxide is greater than, or less than, a stoichiometric amount, and
wherein a content of sulfur of the metal sulfide is greater than, or less than, a stoichiometric amount.

2. The synaptic device of claim 1, wherein the channel layer comprises at least one of $TiO_2$, $In_2O_3$, $SnO_2$, ZnO, InTiO, SnTiO, ZnTiO, InSnO, ZnSnO, and InZnO.

3. The synaptic device of claim 1, wherein the piezoelectric film comprises at least one of PbZrTiO (PZT), BaSrTiO (BST), $HfO_2$ and HfZrO.

4. The synaptic device of claim 1, wherein the charge supply dielectric film is interposed between the channel layer and the gate electrode,
wherein the piezoelectric film is interposed between the charge supply dielectric film and the gate electrode.

5. The synaptic device of claim 1, wherein the piezoelectric film is interposed between the channel layer and the gate electrode,
wherein the charge supply dielectric film is interposed between the piezoelectric film and the gate electrode.

6. The synaptic device of claim 1, further comprising a source electrode and a drain electrode on the channel layer,
wherein the gate electrode comprises at least one of Al, Ag, Au, Pt, Mo, Ni, TIN, ITO, AlZnO (AZO), GaZnO, AZO/Ag/AZO (OMO structure), and $SnO_2$.

7. The synaptic device of claim 6, wherein the gate electrode is interposed between the gate dielectric layer and the substrate,
wherein the source electrode and the drain electrode are provided on the gate dielectric layer and cover at least a portion of the channel layer.

8. The synaptic device of claim 7, wherein the source electrode and the drain electrode are horizontally spaced apart from each other,
wherein the channel layer is exposed to the outside between the source electrode and the drain electrode.

9. The synaptic device of claim 1, wherein the substrate comprises at least one of silicon, silicon oxide, metal, compound semiconductor, glass, polyimide, PET, PEN, TAC, and metal foil.

10. The synaptic device of claim 1, further comprising a touch panel on the gate electrode.

* * * * *